US012088151B2

United States Patent
Fukushima et al.

(10) Patent No.: US 12,088,151 B2
(45) Date of Patent: Sep. 10, 2024

(54) ACTUATOR

(71) Applicant: THK CO., LTD., Tokyo (JP)

(72) Inventors: Katsuya Fukushima, Tokyo (JP); Satoshi Hara, Tokyo (JP); Shogo Wakuta, Tokyo (JP); Yukihiro Yamada, Tokyo (JP); Masashi Ishii, Tokyo (JP); Tomofumi Mizuno, Tokyo (JP)

(73) Assignee: THK CO., LTD., Tokyo (JP)

( * ) Notice: Subject to any disclaimer, the term of this patent is extended or adjusted under 35 U.S.C. 154(b) by 27 days.

(21) Appl. No.: 17/627,216

(22) PCT Filed: Jul. 9, 2020

(86) PCT No.: PCT/JP2020/026791
§ 371 (c)(1),
(2) Date: Jan. 14, 2022

(87) PCT Pub. No.: WO2021/010267
PCT Pub. Date: Jan. 21, 2021

(65) Prior Publication Data
US 2022/0320968 A1    Oct. 6, 2022

(30) Foreign Application Priority Data

Jul. 18, 2019    (JP) .................................. 2019-132620

(51) Int. Cl.
*H02K 11/20*    (2016.01)
*H02K 11/30*    (2016.01)
*H02K 41/02*    (2006.01)

(52) U.S. Cl.
CPC ............ *H02K 11/20* (2016.01); *H02K 11/30* (2016.01); *H02K 41/02* (2013.01)

(58) Field of Classification Search
CPC ........ H02K 11/00; H02K 11/20; H02K 11/30; H02K 41/00; H02K 41/02; H02K 41/03; H05K 13/04; H05K 13/0406
See application file for complete search history.

(56) References Cited

U.S. PATENT DOCUMENTS 7,868,490 B2    1/2011    Nagai et al.
2001/0043133 A1    11/2001    Takanashi et al.
(Continued)

FOREIGN PATENT DOCUMENTS

JP    2001-333566 A    11/2001
JP    2002-369484 A    12/2002
(Continued)

OTHER PUBLICATIONS

International Search Report dated Sep. 8, 2020, issued in counterpart International Application No. PCT/JP2020/026791, w/English translation (4 pages).
(Continued)

*Primary Examiner* — Tran N Nguyen
(74) *Attorney, Agent, or Firm* — WHDA, LLP

(57) ABSTRACT

Provided is an actuator including a shaft, a drive part that moves the shaft, a fixing part disposed around the shaft, the shaft being moved relative to the fixing part, a detecting part that detects a force applied to the shaft on a side closer to the drive part than to the fixing part, and a control device that obtains a first force that is detected by the detecting part in a predetermined period of a period during which the shaft is being moved before the shaft applies the force to a workpiece, and after the predetermined period, controls the drive part based on the force detected by the detecting part and the first force.

6 Claims, 8 Drawing Sheets

(56) References Cited

U.S. PATENT DOCUMENTS

2010/0000080 A1* 1/2010 Eldridge ............ G01R 31/2874
                                                      29/729
2010/0269330 A1* 10/2010 Higuchi ................ H01L 24/75
                                                      29/729

FOREIGN PATENT DOCUMENTS

| JP | 2007-30078 A | 2/2007 |
| --- | --- | --- |
| JP | 2009-164347 A | 7/2009 |
| JP | 2010-188504 A | 9/2010 |
| JP | 2012-146762 A | 8/2012 |
| JP | 2016-80554 A | 5/2016 |
| JP | 2016-156707 A | 9/2016 |
| JP | WO2014/058051 A1 | 9/2016 |
| JP | 2017-077051 A | 4/2017 |

OTHER PUBLICATIONS

Office Action dated Apr. 19, 2023, issued in counterpart CN aplication No. 202080051600.4, with English translation. (20 pages).
Office Action dated May 9, 2023, issued in couterpart JP application No. 2019-132620 with English translation. (9 pages).
Office Action dated Jun. 8, 2023, issued in counterpart IN application No. 202247007347 with English translation. (6 pages).

* cited by examiner

[Fig. 1]
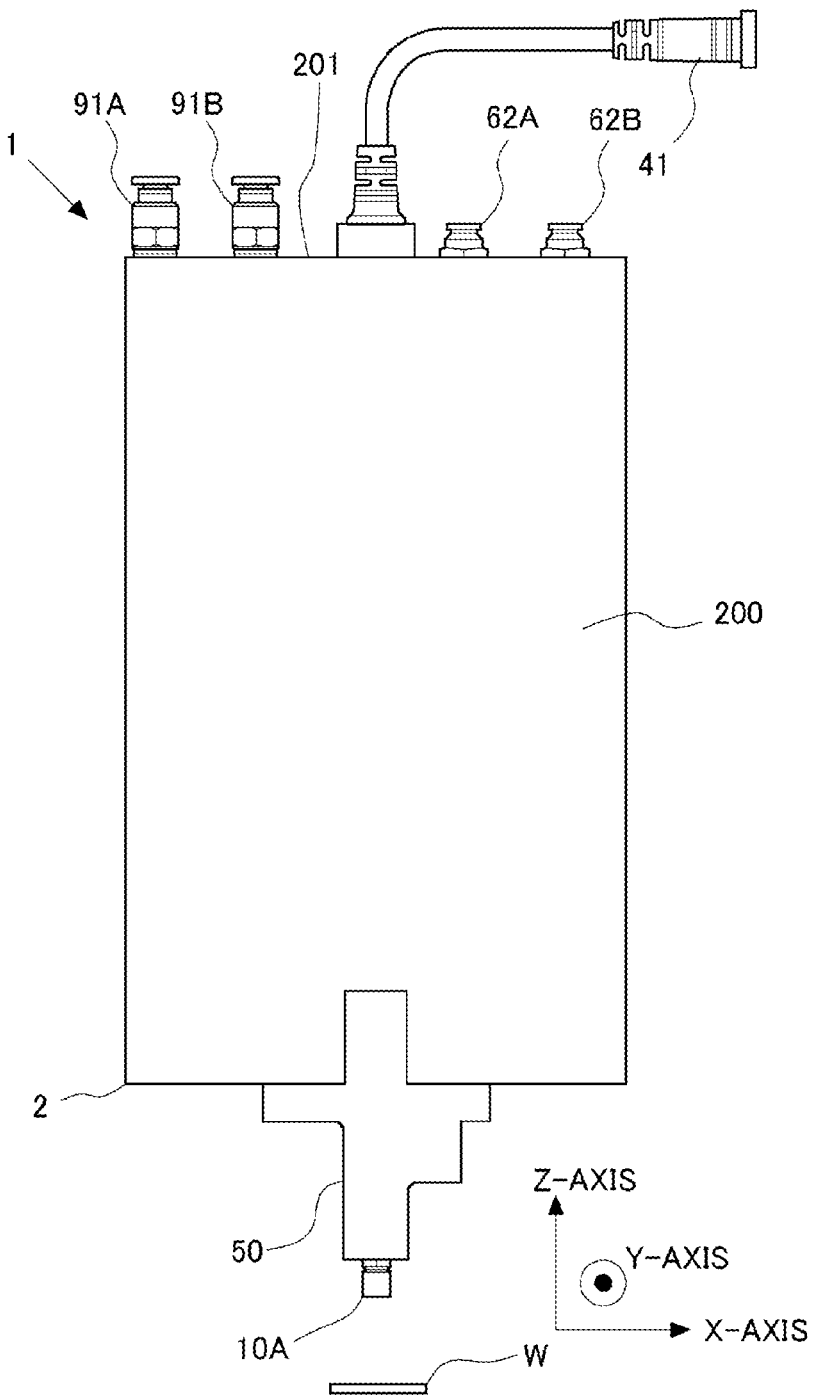

[Fig. 2]
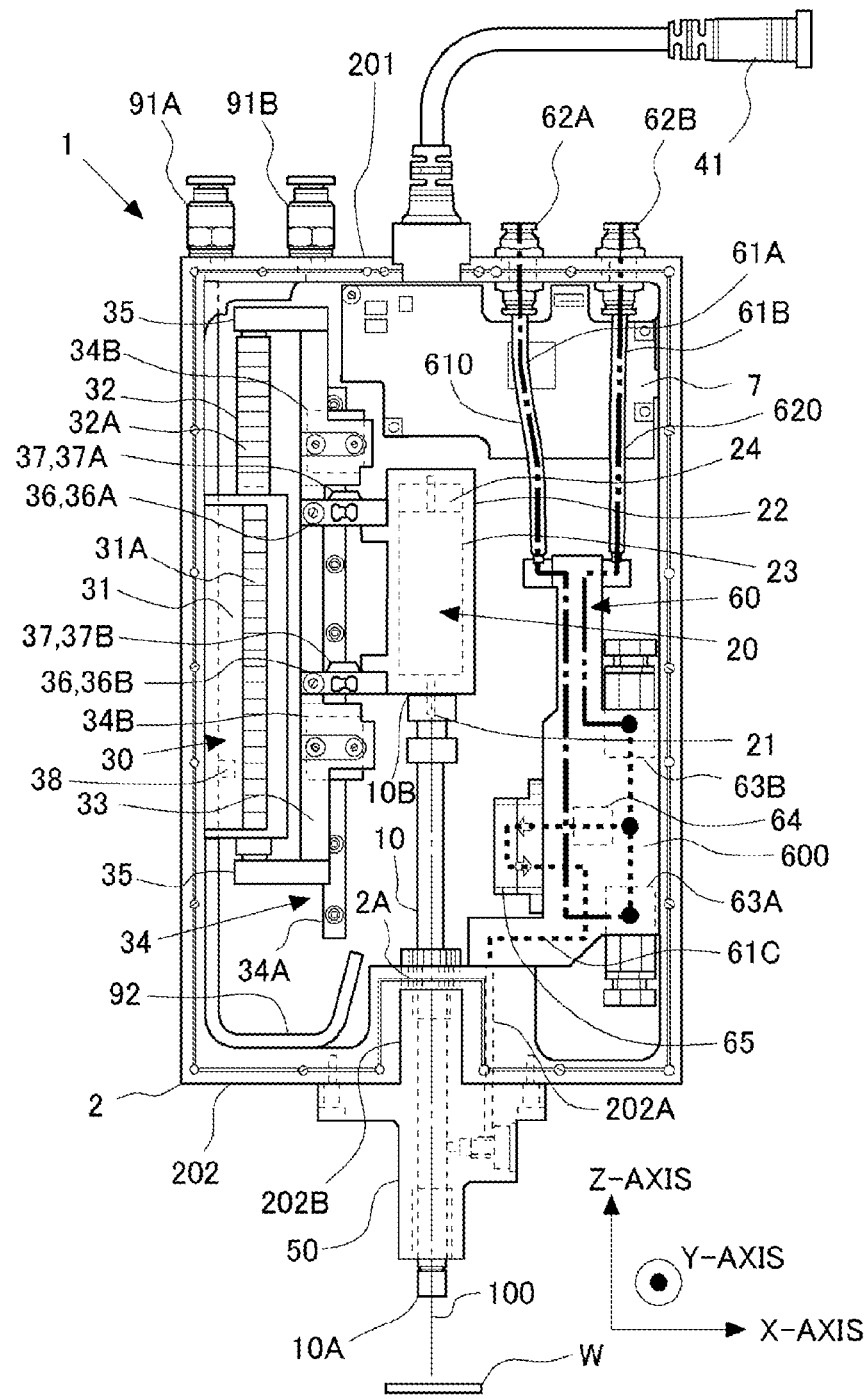

[Fig. 3]
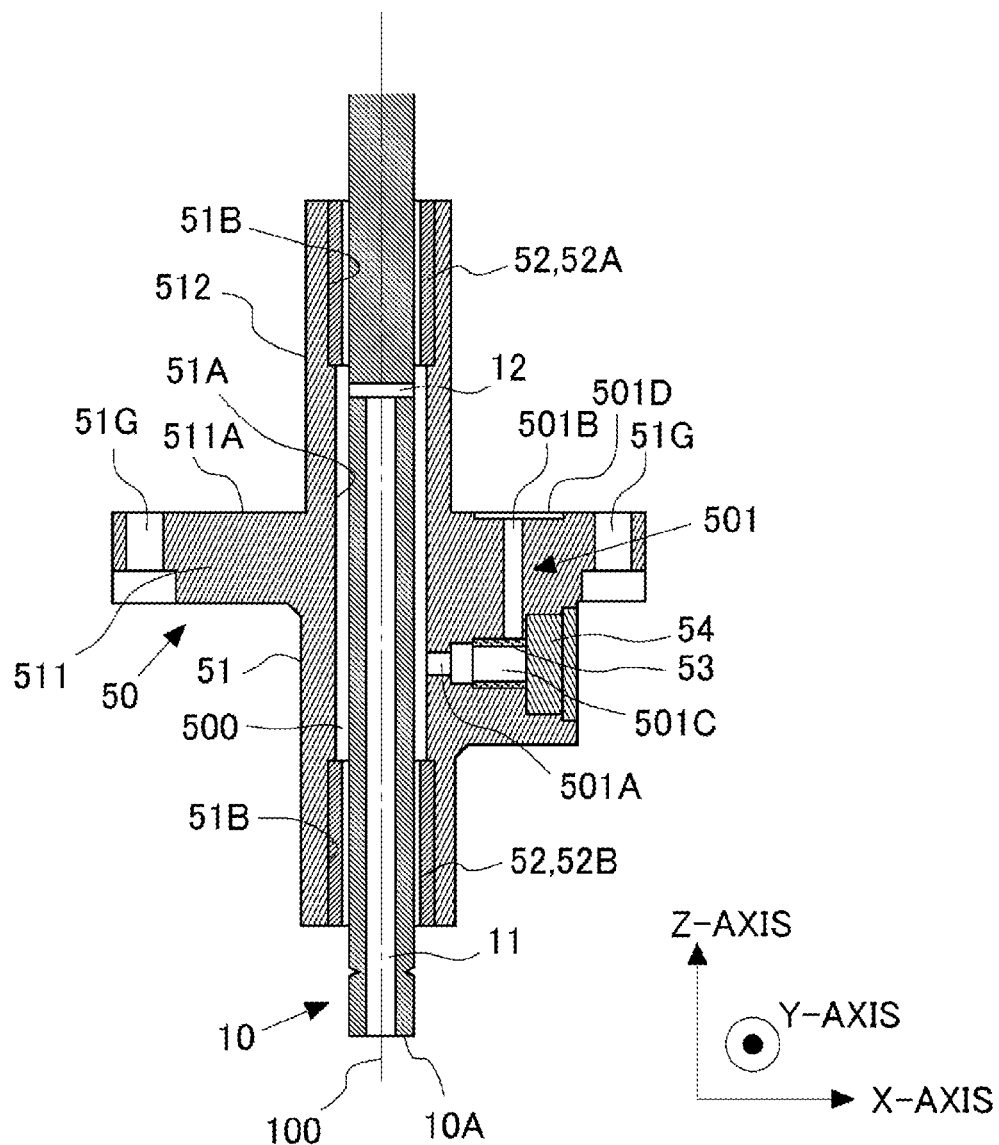

[Fig. 4]
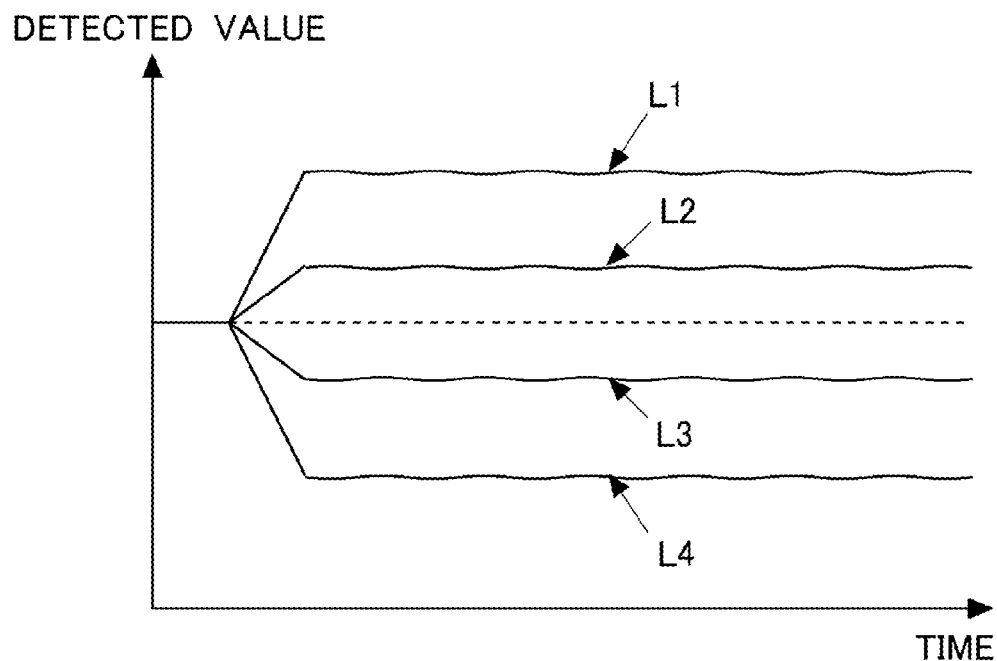

[Fig. 5]
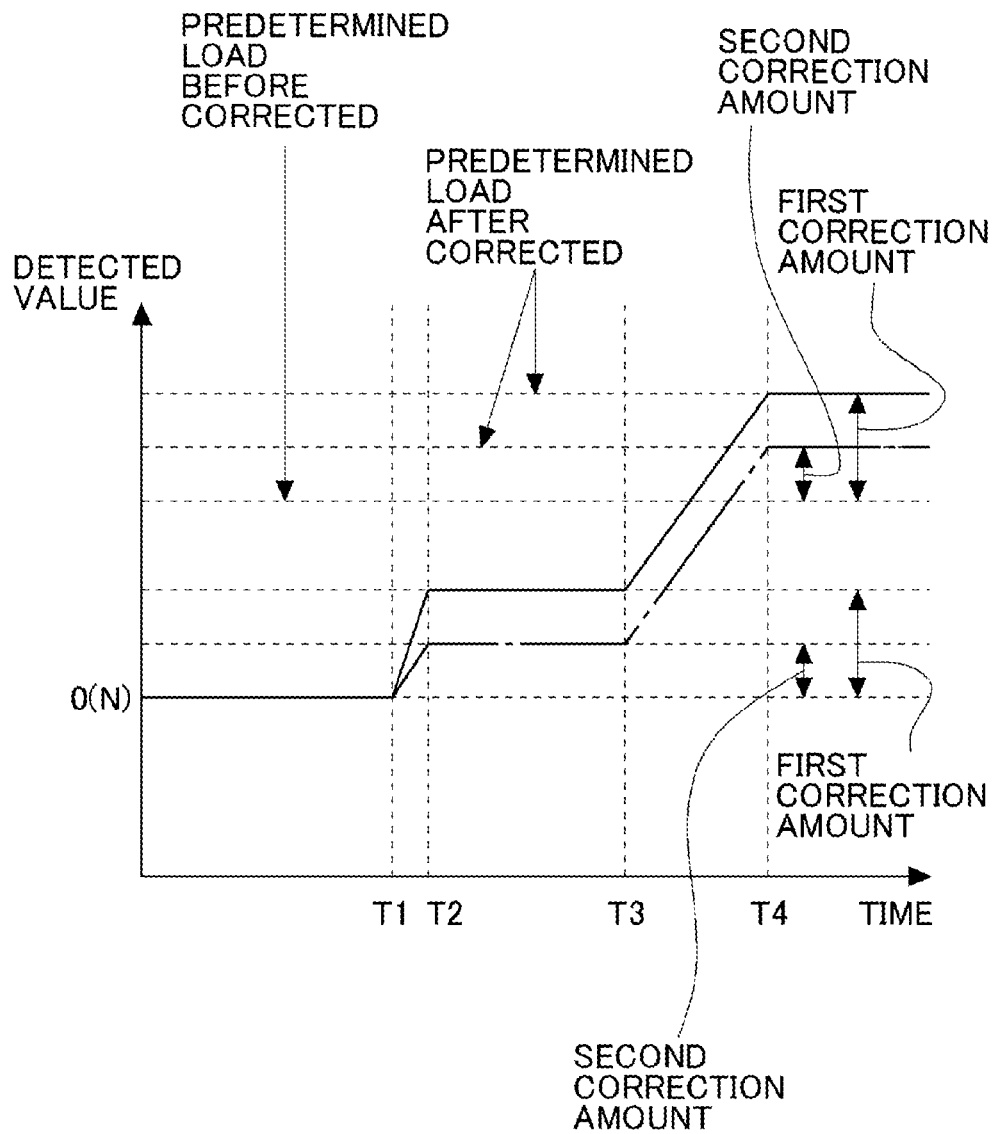

[Fig. 6]
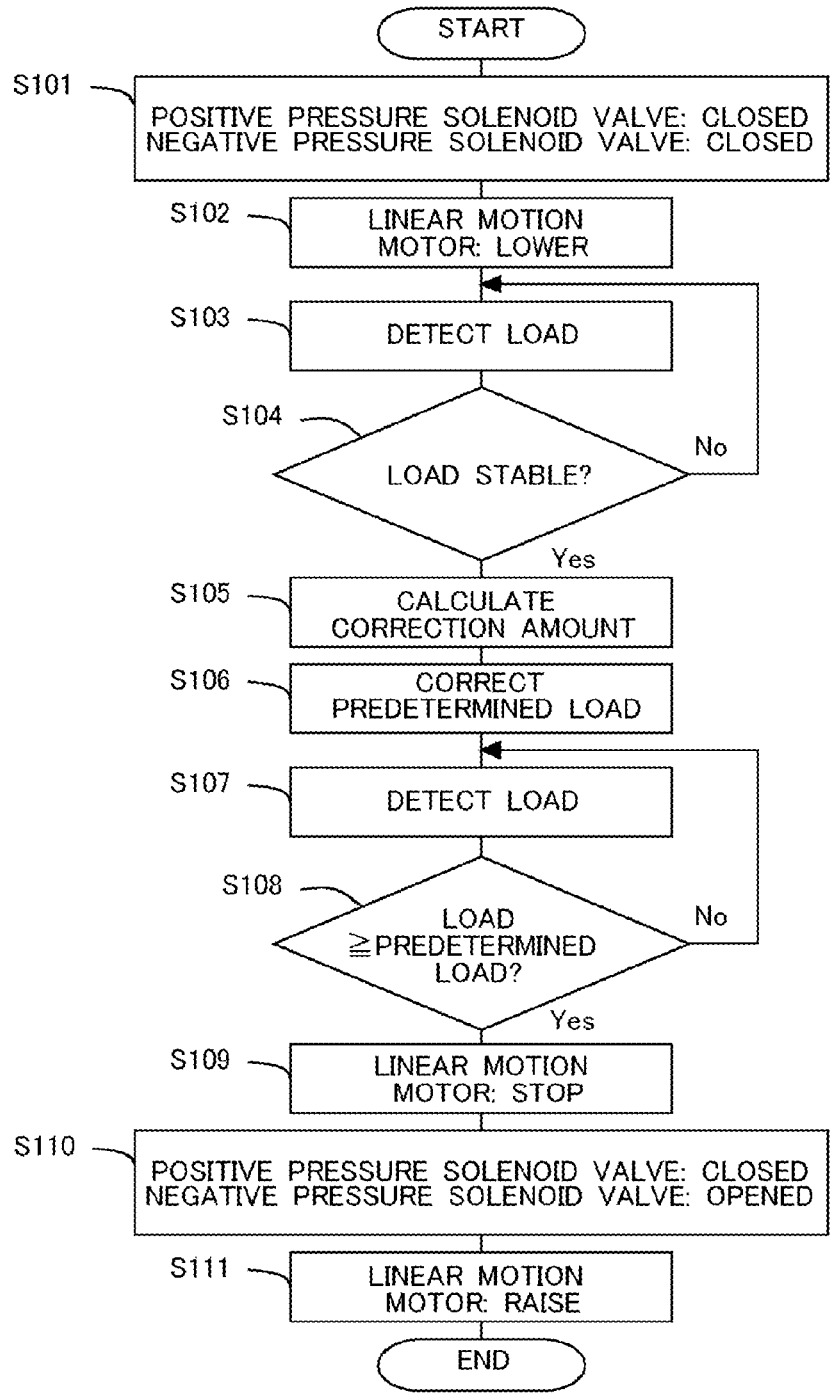

[Fig. 7]
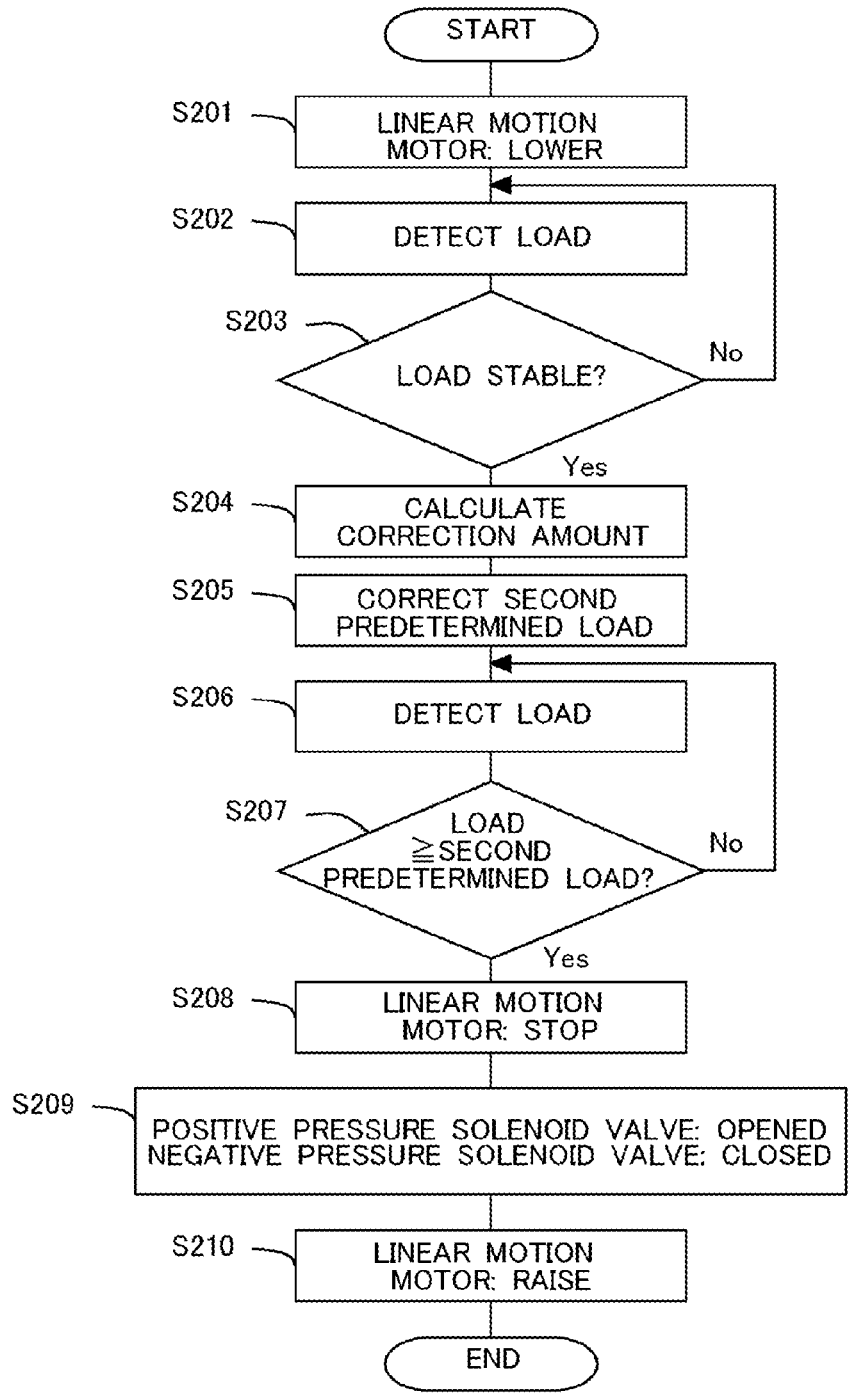

[Fig. 8]
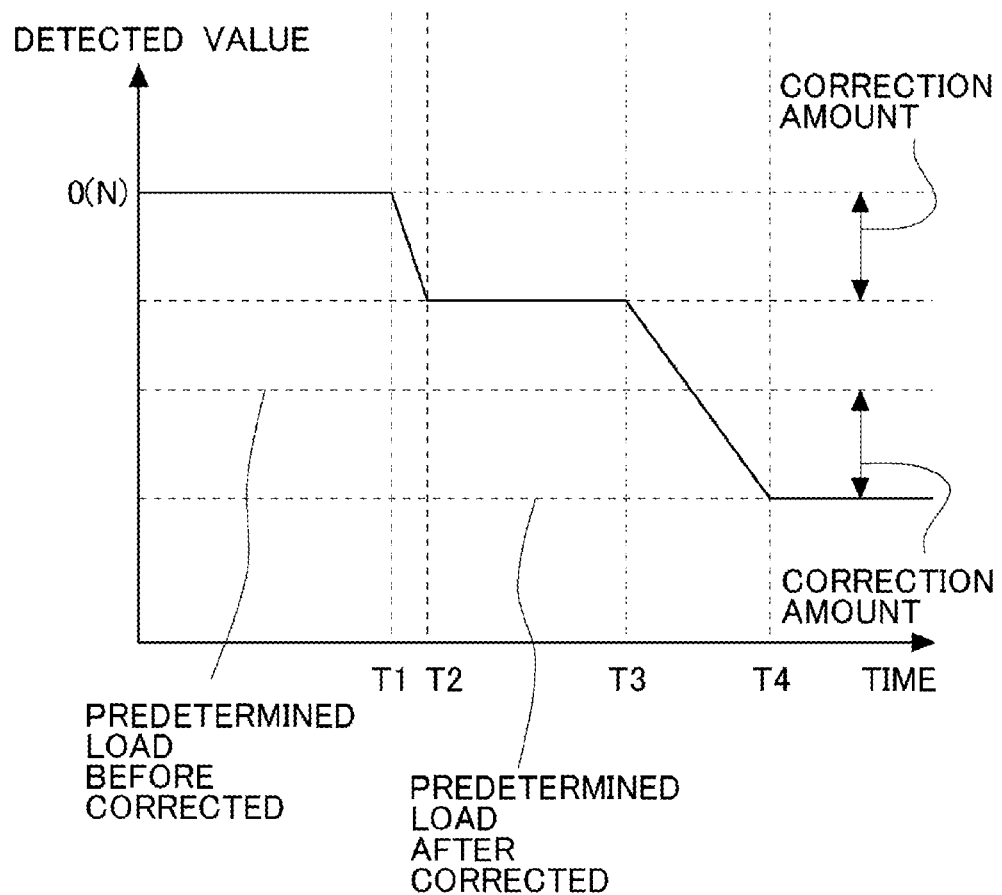

ACTUATOR

TECHNICAL FIELD

The present invention relates to an actuator.

BACKGROUND ART

A workpiece can be sucked to a hollow shaft and picked up by providing a negative pressure to an interior of the shaft while the shaft is pressed against the workpiece. Here, if there is a space between the workpiece and the shaft when the workpiece is sucked to the shaft, the workpiece might strongly collide with the shaft and be damaged, or the workpiece could not be sucked. On the other hand, if a load to press the workpiece is excessively large, the workpiece might be damaged. Therefore, it is desirable to press the shaft against the workpiece with an appropriate load. Furthermore, if a speed of the shaft is high when the shaft comes in contact with the workpiece, the workpiece might be damaged due to the collision of the shaft with the workpiece. Therefore, it is desirable to reduce this impact. Heretofore, a chuck member has been provided to a tip of a shaft body via a cushioning member such as a spring (e.g., see Patent Document 1). Specifically, the spring contracts to reduce the impact, when the chuck member comes in contact with the workpiece. Afterward, when the shaft further moves toward the workpiece, the workpiece is pressed with a load corresponding to a spring constant.

CITATION LIST

Patent Literature

[Patent Literature 1] Japanese Patent Laid-Open No. 2009-164347

SUMMARY OF INVENTION

Technical Problem

Here, it is conceivable to detect a load generated between a shaft and a workpiece by providing, for example, a force sensor that detects a force applied to the shaft. Then, it is conceivable to control the load generated between the shaft and the workpiece by moving the shaft based on a detected value. However, if the shaft is slid in a guide or the like, the detected value of the force sensor may change due to generation of a friction force. Consequently, the detected value of the force sensor may not indicate an actual load generated between the shaft and the workpiece. Then, in a case where the shaft is moved based on the detected value of the force sensor, the actual load generated between the shaft and the workpiece might not meet a required value. While it is also conceivable to determine influence of the friction force beforehand, the friction force changes due to factors such as aging of the shaft or the like, temperature, and humidity.

An object of the present invention, which has been made in view of various actual situations described above, is to provide an actuator in which a load applied to a shaft and a workpiece is appropriately controlled.

Solution to Problem

One of aspects of the present invention is an actuator comprising a shaft that is moved in a direction of a central axis to apply a force to a workpiece, a drive part that moves the shaft in the direction of the central axis, a fixing part disposed around the shaft, the shaft being moved relative to the fixing part when the drive part moves the shaft, a detecting part that detects the force applied to the shaft on a side closer to the drive part than to the fixing part, and a control device that controls the drive part, wherein the control device obtains a first force that is detected by the detecting part in a predetermined period of a period during which the shaft is being moved before the shaft applies the force to the workpiece, and after the predetermined period, controls the drive part based on the force detected by the detecting part and the first force.

Effects of the Invention

According to the present invention, in an actuator, a load applied to a shaft and a workpiece can be appropriately controlled.

BRIEF DESCRIPTION OF DRAWINGS

FIG. 1 is an appearance view of an actuator according to an embodiment.

FIG. 2 is a schematic configuration view illustrating an inner structure of the actuator according to the embodiment.

FIG. 3 is a cross-sectional view illustrating a schematic configuration including a shaft housing and a tip of a shaft according to the embodiment.

FIG. 4 is a time chart illustrating transition of a detected value of a strain gauge according to the embodiment.

FIG. 5 is a time chart illustrating transition of a detected value of a strain gauge during pickup of a workpiece according to a first embodiment.

FIG. 6 is a flowchart illustrating flow of pickup processing according to a first embodiment.

FIG. 7 is a flowchart illustrating flow of place processing according to the first embodiment.

FIG. 8 is a time chart illustrating transition of a detected value of a strain gauge during pickup of a workpiece according to a second embodiment.

MODE FOR CARRYING OUT THE INVENTION

In an actuator according to one of aspects of the present invention, a drive part moves a shaft in a direction of a central axis of the shaft. The drive part moves the shaft, when a workpiece is to be picked up, the workpiece is to be pressed, or the workpiece is to be placed. The drive part may be, for example, a linear motion motor such as a linear motor. Also, another member may be interposed between the drive part and the shaft. Further, the shaft may be supported rotatably about the central axis. When the shaft is moved in the central axis direction, the shaft moves relative to a fixing part. The fixing part may be fixed to, for example, a housing of the actuator, or may be the housing itself. The fixing part may be a member that may come in contact with the shaft, or may be a member on which the shaft is slid. Furthermore, the fixing part may be, for example, a guide that guides the shaft, or may be a member including a negative pressure supply mechanism that supplies a negative pressure to the shaft. A space may be provided between the fixing part and the shaft such that the drive part can move the shaft.

For the shaft, for example, when a force is applied from the shaft to the workpiece to pick up the workpiece, press the workpiece, or place the workpiece, a load is generated between the shaft and the workpiece. A detecting part detects the force at this time. Hereinafter, the force detected by the detecting part will be referred to as a detected value. Note that there are not any limitations on a configuration of the detecting part as long as the part can detect the force applied to the shaft. The detecting part may be, for example, a sensor in which a strain gauge is used, or a piezoelectric sensor. Alternatively, the detecting part may be a load cell.

The control device controls the drive part. At this time, the control device performs control, for example, based on the detected value of the detecting part. However, when the shaft is slid relative to the fixing part, the detected value of the detecting part may change depending on a friction force generated at this time. For example, even when the actuator is manufactured such that the shaft does not come in contact with the fixing part, the shaft might come in contact with the fixing part and be slid due to influence of tolerance or deterioration over time. Then, when the shaft is being moved to come close to the workpiece, the friction force is generated to the shaft in a direction away from the workpiece, and when the shaft is being moved away from the workpiece, the friction force is generated to the shaft in a direction coming close to the workpiece. Therefore, when the shaft is in contact with the workpiece, a deviation may be made between the force applied to the workpiece by the shaft and the detected value of the detecting part.

Then, the control device further controls the drive part based on a first force associated with the friction force. The control device obtains the first force in a predetermined period of a period during which the shaft is being moved before the shaft applies the force to the workpiece. In the period before the shaft applies the force to the workpiece, the detected value of the detecting part is not influenced by a reaction force from the workpiece, and hence influence of the friction force can be more accurately detected. Furthermore, while the shaft is being moved, the detected value of the detecting part is influenced by a dynamic friction force, and hence the influence of the dynamic friction force can be detected. "Before the shaft applies the force to the workpiece" may be, for example, before the shaft comes in contact with the workpiece during the pickup of the workpiece or the pressing of the workpiece, or may be before the workpiece is grounded or before the workpiece comes in contact with another member during the placing of the workpiece. Note that the predetermined period may be a period during which the detected value of the detecting part is stable. For example, immediately after the shaft starts moving, the detected value of the detecting part is influenced by an acceleration of the shaft, and hence the detected value of the detecting part may not be stable. Therefore, a value highly associated with the friction force can be obtained by obtaining the first force when the detected value of the detecting part is stable. Alternatively, for example, the first force may have a value obtained by smoothing the detected value in the predetermined period, a value obtained by averaging the detected values in the predetermined period, a value obtained by moderating the detected value in a predetermined manner in the predetermined period, or an instantaneous value at any time point in the predetermined period.

Then, the control device after the predetermined period, controls the drive part based on the detected value of the detecting part and the first force, thereby allowing the control in consideration of the friction force. Consequently, an appropriate load can be applied to the workpiece, and hence the workpiece can be more securely picked up, pressed or placed, while inhibiting damage on the workpiece. Note that the first force can be obtained, for example, every time the workpiece is to be picked up, pressed or placed. Then, even in a case where the friction force changes depending on temperature or humidity, it is possible to respond quickly to the change.

Alternatively, in or before the predetermined period, the control device may control the drive part, for example, based on the detected value of the detecting part, or may control the drive part based on a detected value of another sensor (e.g., a sensor that detects a position of the shaft).

Alternatively, the control device may obtain the first force during, when the shaft is being moved in the direction coming close to the workpiece in the predetermined period.

A direction in which the friction force acts changes depending on a direction in which the shaft is moved. It is possible to obtain the first force in the same direction as a direction of the force applied to the shaft when the workpiece is picked up, pressed or placed, by detecting the first force when the shaft is being moved in the direction coming close to the workpiece. Furthermore, the dynamic friction force can be obtained when the shaft is being moved.

The control device may set the predetermined period as a period during which a fluctuation of the force detected by the detecting part continues in a state of being in a predetermined range.

Here, when a moving speed of the shaft changes, the detected value of the detecting part is influenced by the acceleration. For example, the detected value of the detecting part noticeably fluctuates immediately after the shaft starts moving. On the other hand, as the influence of the acceleration on the detected value of the detecting part decreases, the fluctuation of the detected value decreases. Therefore, when the fluctuation of the detected value of the detecting part falls in the predetermined range, it is determined that the detected value of the detecting part is stable, and the first force at this time is obtained. Specifically, the predetermined range here is, for example, a range of the fluctuation in which the detected value of the detecting part is considered to be stable, that is, the range of the fluctuation in which detection accuracy of the friction force is in a permissible range. Alternatively, the period during which the fluctuation of the detected value is continuously in the predetermined range may be counted, and in a case where this period reaches a threshold, the period may be set as the predetermined period. In this case, an average value of the detected values in the predetermined period or a value obtained by moderating the detected value in the predetermined period may be obtained as the first force. Thus, the first force is obtained when the detected value is stable, so that the influence of the friction force can be more accurately obtained, and subsequent control of the drive part can be more appropriately performed.

Alternatively, the control device may set the predetermined period as a period during which a fluctuation of the speed of the shaft continues in a state of being in a predetermined range.

For example, the speed of the shaft can be obtained as change over time by detecting the speed of the shaft with a position sensor or the like. Then, when the speed of the shaft is stable, the fluctuation of the detected value of the detecting part decreases. Therefore, when the fluctuation of the speed of the shaft falls in a predetermined range, it may be determined that the speed of the shaft is stable, and the first force may be obtained at this time. Specifically, the predetermined range here is, for example, a range of the fluctuation in which the speed of the shaft is considered to be stable, that is, a range of the fluctuation in which detection accuracy of the friction force falls in a permissible range. Alternatively, a period during which the fluctuation of the speed of the shaft is continuously in the predetermined range may be counted, and in a case where this period reaches a threshold, the period may be set as the predetermined period. In this case, an average value of the detected values in the predetermined period or a value obtained by moderating the detected value in the predetermined period may be obtained as the first force. Thus, the influence of the friction force can be more accurately obtained by obtaining the first force when the speed of the shaft is stable, and hence the subsequent control of the drive part can be more appropriately performed.

Alternatively, the control device may perform, after the predetermined period, stop control that is control to stop the drive part when the force detected by the detecting part reaches a predetermined value or more, and the control device, in the stop control, may correct the predetermined value by adding the first force to the predetermined value, or may correct the force detected by the detecting part by subtracting the first force from the force detected by the detecting part.

Alternatively, the predetermined value may indicate the force by which it is determined that the shaft comes in contact with the workpiece during the pickup of the workpiece or during the pressing of the workpiece. Furthermore, the predetermined value may indicate a force with which the workpiece can be more securely picked up while inhibiting the damage on the workpiece, during the pickup of the workpiece. Additionally, the predetermined value may indicate a force with which the workpiece can be more securely pressed while inhibiting the damage on the workpiece, during the pressing of the workpiece. In addition, the predetermined value may indicate, for example, a force by which it is determined that the workpiece is grounded, or a force by which it is determined that the workpiece comes in contact with another member, during the placing of the workpiece. Furthermore, the predetermined value may indicate a force with which the workpiece can be more securely pressed against the other member while inhibiting the damage on the workpiece, during the placing of the workpiece. The predetermined value can be changed in accordance with a type of workpiece. In a case where the detected value of the detecting part is equal to or more than a predetermined value, the drive part is stopped, so that the shaft can be immediately stopped when the shaft comes in contact with the workpiece, or the shaft can be immediately stopped when the workpiece is grounded or when the workpiece comes in contact with the other member. Furthermore, an appropriate force can be applied to the workpiece during the pickup, the placing or the pressing of the workpiece. However, in a case where the friction force is generated by the fixing part, it is considered that an actual force applied to the workpiece deviates by the first force from the detected value of the detecting part. On the other hand, the deviation between the actual force applied to the workpiece and the detected value of the detecting part can be eliminated by deviating, by the first force, the detected value of the detecting part or the predetermined value when performing the stop control. Specifically, the detected value of the detecting part increases by the first force, and hence the detected value of the detecting part may be corrected by subtracting the first force from the detected value of the detecting part. On the other hand, in the stop control, the same effect can be obtained also by adding the first force to the predetermined value. Thus, the stop control is performed, to allow the stop control in consideration of the influence of the friction force, and hence, for example, the contact with the workpiece can be more securely detected. Note that the shaft may not come in contact with the fixing part depending on a state of the shaft and the fixing part. In this case, the first force may be set, for example, to 0 in the stop control.

Alternatively, the control device may perform, after the predetermined period, feedback control of the drive part such that the force detected by the detecting part reaches a predetermined value, and the control device, in the feedback control, may correct the predetermined value by adding the first force to the predetermined value, or may correct the force detected by the detecting part by subtracting the first force from the force detected by the detecting part.

Note that the predetermined value may indicate a force required during the pickup of the workpiece, a force required during the pressing of the workpiece, or a force required during the placing of the workpiece. Alternatively, the predetermined value may indicate a force with which the workpiece can be more securely picked up while inhibiting the damage on the workpiece, during the pickup of the workpiece. Furthermore, the predetermined value may indicate a force with which the workpiece can be more securely pressed while inhibiting the damage on the workpiece, during the pressing of the workpiece. Additionally, the predetermined value may indicate a force with which the workpiece can be more securely pressed against the other member while inhibiting the damage on the workpiece, during the placing of the workpiece. The predetermined value can be changed in accordance with the type of workpiece. The drive part is feedback controlled such that the detected value of the detecting part reaches the predetermined value, so that, for example, the pickup of the workpiece, the pressing of the workpiece, or the placing of the workpiece can be more securely executed. However, in a case where the friction force is generated by the fixing part, it is considered that the actual force applied to the workpiece deviates by the first force from the detected value of the detecting part. On the other hand, the deviation between the actual force applied to the workpiece and the detected value of the detecting part can be eliminated by deviating, by the first force, the detected value of the detecting part or the predetermined value when performing the feedback control. Specifically, the detected value of the detecting part increases by the first force, and hence the detected value of the detecting part may be corrected by subtracting the first force from the detected value of the detecting part. On the other hand, in the feedback control, the same effect can be obtained also by adding the first force to the predetermined value. Thus, the feedback control is performed, to allow the feedback control in consideration of the influence of the friction force, and hence an appropriate force can be added to the workpiece. Note that the shaft may not come in contact with the fixing part depending on the state of the shaft and the fixing part. In this case, the first force may be set, for example, to 0 in the feedback control.

Hereinafter, modes for carrying out the present invention will be described with reference to the drawings. However, a dimension, material, shape, relative arrangement and the like of a component described in this embodiment do not restrict the scope of the invention unless otherwise described. Furthermore, the following embodiments can be combined as much as possible.

First Embodiment

FIG. 1 is an appearance view of an actuator 1 according to the present embodiment. The actuator 1 includes a housing 2 having a substantially rectangular parallelepiped outer shape, and a lid 200 is attached to the housing 2. FIG. 2 is a schematic configuration view illustrating an inner structure of the actuator 1 according to the present embodiment. A part of a shaft 10 is housed within the housing 2. The shaft 10 is formed to be hollow on a tip 10A side. In a material of the shaft 10 and the housing 2, for example, a metal (e.g., aluminum) may be used, or a resin or the like may be used. Note that in the following description, an XYZ orthogonal coordinate system will be set, and positions of respective members will be described with reference to this XYZ orthogonal coordinate system. A long side direction of the largest surface of the housing 2, i.e., a direction of a central axis 100 of the shaft 10 is a Z-axis direction, a short side direction of the largest surface of the housing 2 is an X-axis direction, and a direction that is orthogonal to the largest surface of the housing 2 is a Y-axis direction. The Z-axis direction is also a perpendicular direction. Note that hereinafter, an upper side in the Z-axis direction in FIG. 2 is an upper side of the actuator 1, and a lower side in the Z-axis direction in FIG. 2 is a lower side of the actuator 1. Furthermore, a right side in the X-axis direction in FIG. 2 is a right side of the actuator 1, and a left side in the X-axis direction in FIG. 2 is a left side of the actuator 1. Additionally, a front side in the Y-axis direction in FIG. 2 is a front side of the actuator 1, and a back side in the Y-axis direction in FIG. 2 is a back side of the actuator 1. The housing 2 is formed such that a dimension in the Z-axis direction is larger than a dimension in the X-axis direction, and a dimension in the X-axis direction is larger than a dimension in the Y-axis direction. In the housing 2, a region corresponding to one surface (a front surface in FIG. 2) orthogonal to the Y-axis direction is open, and this opening is closed with the lid 200. The lid 200 is fixed to the housing 2 with, for example, screws.

The housing 2 houses therein a rotating motor 20 that rotates the shaft 10 about the central axis 100, a linear motion motor 30 that moves the shaft 10 relatively straight in a direction along the central axis 100 (i.e., the Z-axis direction) relative to the housing 2, and an air control mechanism 60. Furthermore, a shaft housing 50 into which the shaft 10 is inserted is attached to a lower end face 202 of the housing 2 in the Z-axis direction. In the housing 2, a recess 202B is formed to be recessed from the lower end face 202 toward an interior of the housing 2, and a part of the shaft housing 50 is inserted into the recess 202B. A through hole 2A in the Z-axis direction is formed in an upper end of the recess 202B in the Z-axis direction, and the shaft 10 is inserted into the through hole 2A and the shaft housing 50. The tip 10A of the shaft 10 on the lower side in the Z-axis direction protrudes outward from the shaft housing 50. The shaft 10 is provided at a center of the housing 2 in the X-axis direction and a center of the housing in the Y-axis direction. That is, the shaft 10 is provided such that a central axis extending in the Z-axis direction through the center of the housing 2 in the X-axis direction and the center of the housing in the Y-axis direction is superimposed on the central axis 100 of the shaft 10. The shaft 10 is moved straight in the Z-axis direction by the linear motion motor 30, and is rotated about the central axis 100 by the rotating motor 20. In addition, the linear motion motor 30 is an example of the drive part.

A base end 10B side of the shaft 10 that is an end on a side opposite to the tip 10A (an upper end in the Z-axis direction) is housed in the housing 2, and connected to an output shaft 21 of the rotating motor 20. The rotating motor 20 rotatably supports the shaft 10. A central axis of the output shaft 21 of the rotating motor 20 coincides with the central axis 100 of the shaft 10. The rotating motor 20 includes, in addition to the output shaft 21, a stator 22, a rotor 23 that rotates in the stator 22, and a rotary encoder 24 that detects a rotation angle of the output shaft 21. The rotor 23 rotates relative to the stator 22, and the output shaft 21 and the shaft 10 also rotate in conjunction with the stator 22.

The linear motion motor 30 includes a stator 31 fixed to the housing 2, and a mover 32 that relatively moves in the Z-axis direction relative to the stator 31. The linear motion motor 30 is, for example, a linear motor. The stator 31 is provided with a plurality of coils 31A, and the mover 32 is provided with a plurality of permanent magnets 32A. The coils 31A are arranged at a predetermined pitch in the Z-axis direction, and a plurality of sets of three coils 31A of U, V, and W-phases are provided. In the present embodiment, a three-phase armature current is applied to the coils 31A of the U, V, and W-phases to generate a straight moving magnetic field, and the mover 32 is straight moved relative to the stator 31. The linear motion motor 30 is provided with a linear encoder 38 that detects a relative position of the mover 32 to the stator 31. Note that in place of the above configuration, the stator 31 may be provided with a permanent magnet, and the mover 32 may be provided with a plurality of coils.

The mover 32 of the linear motion motor 30 is coupled to the stator 22 of the rotating motor 20 via a linear motion table 33. The linear motion table 33 is movable with movement of the mover 32 of the linear motion motor 30. The movement of the linear motion table 33 is guided in the Z-axis direction by a linear motion guide device 34. The linear motion guide device 34 includes a rail 34A fixed to the housing 2, and a slider block 34B attached to the rail 34A. The rail 34A is configured to extend in the Z-axis direction, and the slider block 34B is configured to be movable along the rail 34A in the Z-axis direction.

The linear motion table 33 is fixed to the slider block 34B, and is movable together with the slider block 34B in the Z-axis direction. The linear motion table 33 is coupled to the mover 32 of the linear motion motor 30 via two coupling arms 35. The two coupling arms 35 couple opposite ends of the mover 32 in the Z-axis direction to opposite ends of the linear motion table 33 in the Z-axis direction. Furthermore, the linear motion table 33 is coupled, on a central side of the opposite ends, to the stator 22 of the rotating motor 20 via two coupling arms 36. Note that the coupling arm 36 on the upper side in the Z-axis direction will be referred to as a first arm 36A, and the coupling arm 36 on the lower side in the Z-axis direction will be referred to as a second arm 36B. Furthermore, the first arm 36A and the second arm 36B will be referred to simply as the coupling arms 36 when the arms are not distinguished. For the stator 22 of the rotating motor 20, since the linear motion table 33 is coupled to the stator 22 of the rotating motor 20 via the coupling arms 36, the stator 22 of the rotating motor 20 also moves with the movement of the linear motion table 33. The coupling arm 36 has a quadrangular cross section. A strain gauge 37 is fixed to a surface of each coupling arm 36 which faces upward in the Z-axis direction. Note that the strain gauge 37 fixed to the first arm 36A will be referred to as a first strain gauge 37A, and the strain gauge 37 fixed to the second arm 36B will be referred to as a second strain gauge 37B. The first strain gauge 37A and the second strain gauge 37B will be referred to simply as the strain gauges 37 when the gauges are not distinguished. Note that two strain gauges 37 of the present embodiment are provided on surfaces of the coupling arms 36 which face upward in the Z-axis direction, respectively. In place of the surfaces, the gauges may be provided on surfaces of the coupling arm 36 that face downward in the Z-axis direction. The strain gauge 37 is an example of the detecting part.

The air control mechanism 60 is a mechanism to generate a positive pressure or a negative pressure at the tip 10A of the shaft 10. That is, the air control mechanism 60 sucks air in the shaft 10 during pickup of a workpiece W, to generate the negative pressure at the tip 10A of the shaft 10. Consequently, the workpiece W is sucked to the tip 10A of the shaft 10. Furthermore, air is supplied into the shaft 10, to generate the positive pressure at the tip 10A of the shaft 10. Thus, the workpiece W is easily removed from the tip 10A of the shaft 10.

The air control mechanism 60 includes a positive pressure passage 61A (see a dashed chain line) through which positive pressure air flows, a negative pressure passage 61B (see a double-dashed chain line) through which negative pressure air flows, and a shared passage 61C (see a broken line) shared by the positive pressure air and the negative pressure air. The positive pressure passage 61A has one end connected to a positive pressure connector 62A provided on an upper end face 201 of the housing 2 in the Z-axis direction, and the positive pressure passage 61A has the other end connected to a solenoid valve for positive pressure (hereinafter, referred to as a positive pressure solenoid valve 63A). The positive pressure solenoid valve 63A is opened and closed by an after-mentioned controller 7. Note that the positive pressure passage 61A has one end portion constituted of a tube 610, and the other end portion constituted of a hole made in a block 600. The positive pressure connector 62A extends through the upper end face 201 of the housing 2 in the Z-axis direction, and the positive pressure connector 62A is connected to an external tube linked to an air discharging pump or the like.

The negative pressure passage 61B has one end connected to a negative pressure connector 62B provided on the upper end face 201 of the housing 2 in the Z-axis direction, and the negative pressure passage 61B has the other end connected to a solenoid valve for negative pressure (hereinafter, referred to as a negative pressure solenoid valve 63B). The negative pressure solenoid valve 63B is opened and closed by the after-mentioned controller 7. Note that the negative pressure passage 61B has one end portion constituted of a tube 620, and the other end portion constituted of a hole made in the block 600. The negative pressure connector 62B extends through the upper end face 201 of the housing 2 in the Z-axis direction, and the negative pressure connector 62B is connected to an external tube linked to an air sucking pump or the like.

The shared passage 61C is constituted of a hole made in the block 600. The shared passage 61C has one end branching into two to be connected to the positive pressure solenoid valve 63A and the negative pressure solenoid valve 63B, and the shared passage 61C has the other end connected to an air flow passage 202A that is a through hole formed in the housing 2. The air flow passage 202A communicates with the shaft housing 50. The negative pressure solenoid valve 63B is opened and the positive pressure solenoid valve 63A is closed, to communicate between the negative pressure passage 61B and the shared passage 61C, thereby generating the negative pressure in the shared passage 61C. Then, air is sucked from the shaft housing 50 through the air flow passage 202A. On the other hand, the positive pressure solenoid valve 63A is opened and the negative pressure solenoid valve 63B is closed, to communicate between the positive pressure passage 61A and the shared passage 61C, thereby generating the positive pressure in the shared passage 61C. Then, air is supplied into the shaft housing 50 through the air flow passage 202A. The shared passage 61C is provided with a pressure sensor 64 that detects a pressure of air in the shared passage 61C and a flow sensor 65 that detects a flow rate of air in the shared passage 61C.

Note that in the actuator 1 illustrated in FIG. 2, the positive pressure passage 61A and the negative pressure passage 61B have a part constituted of a tube, and the other part constituted of a hole made in the block 600. The present invention is not limited to this embodiment, and all the passages may be constituted of tubes, or all the passages may be constituted of holes made in the block 600. This also applies to the shared passage 61C, and the passage may be entirely constituted of a tube, or may be constituted by combined use of the tube. Note that a material of the tube 610 and the tube 620 may be a material such as a resin having flexibility, or may be a material such as a metal that does not have any flexibility. Furthermore, an atmospheric pressure may be supplied, instead of supplying the positive pressure to the shaft housing 50 by use of the positive pressure passage 61A.

Additionally, on the upper end face 201 of the housing 2 in the Z-axis direction, provided are a connector (hereinafter, referred to as an inlet connector 91A) that is an inlet of air for cooling the rotating motor 20 and a connector (hereinafter, referred to as an outlet connector 91B) that is an outlet of air from the housing 2. The inlet connector 91A and the outlet connector 91B extend through the upper end face 201 of the housing 2 so that air can flow through. A tube linked to an air discharge pump or the like is connected to the inlet connector 91A from outside the housing 2, and a tube that discharges air flowing out of the housing 2 is connected to the outlet connector 91B from outside the housing 2. The interior of the housing 2 is provided with a metal pipe (hereinafter, referred to as a cooling pipe 92) through which air for cooling the rotating motor 20 flows, and the cooling pipe 92 has one end connected to the inlet connector 91A. The cooling pipe 92 is formed to extend from the inlet connector 91A in the Z-axis direction to a vicinity of the lower end face 202 of the housing 2, and to curve in the vicinity of the lower end face 202 such that the pipe, at the other end, faces the rotating motor 20. Thus, air is supplied from the lower side in the Z-axis direction into the housing 2, thereby allowing efficient cooling. Furthermore, the cooling pipe 92 extends through the stator 31, to take heat from the coils 31A of the linear motion motor 30. The coils 31A are arranged around the cooling pipe 92, to take more heat from the coils 31A provided in the stator 31.

The upper end face 201 of the housing 2 in the Z-axis direction is connected to a connector 41 including a power supplying wire and a signal line. Furthermore, the housing 2 is provided with the controller 7. The wire or signal line pulled from the connector 41 into the housing 2 is connected to the controller 7. The controller 7 is provided with a central processing unit (CPU), a random access memory (PAM), a read only memory (ROM), and an erasable programmable ROM (EPROM), which are connected to one another via a bus. In the EPROM, various programs, various tables and others are stored. The program stored in the EPROM is loaded and executed in a work area of the RAM by the CPU, and through the execution of this program, the rotating motor 20, the linear motion motor 30, the positive pressure solenoid valve 63A, the negative pressure solenoid valve 63B and others are controlled. Thus, the CPU achieves a function that meets a predetermined purpose. Furthermore, output signals of the pressure sensor 64, the flow sensor 65, the strain gauge 37, the rotary encoder 24 and the linear encoder 38 are input into the controller 7. Note that the controller 7 does not have to entirely control the rotating motor 20, the linear motion motor 30, the positive pressure solenoid valve 63A, the negative pressure solenoid valve 63B and others, and another control equipment connected to the connector 41 may control some of these components. Alternatively, the program may be supplied from external control equipment to the controller 7 via the connector 41. In addition, the controller 7 is an example of the control device.

FIG. 3 is a cross-sectional view illustrating a schematic configuration including the shaft housing 50 and the tip 10A of the shaft 10. The shaft housing 50 includes a housing body 51, two rings 52, a filter 53, and a filter stop 54. In addition, the shaft housing 50 or the ring 52 is an example of the fixing part. In the housing body 51, a through hole 51A is formed into which the shaft 10 is inserted. The through hole 51A extends through the housing body 51 in the Z-axis direction, and an upper end of the through hole 51A in the Z-axis direction communicates with the through hole 2A formed in the housing 2. A diameter of the through hole 51A is larger than an outer diameter of the shaft 10. Consequently, a space is provided between an inner surface of the through hole 51A and an outer surface of the shaft 10. In opposite ends of the through hole 51A, enlarged parts 51B each having a hole diameter enlarged are provided. The rings 52 are fitted in two enlarged parts 51B, respectively. Each ring 52 is formed in a cylindrical shape, and an inner diameter of the ring 52 is slightly larger than the outer diameter of the shaft 10. Therefore, the shaft 10 is movable in the Z-axis direction in the ring 52. Consequently, a space is also formed between an inner surface of the ring 52 and the outer surface of the shaft 10. Therefore, the shaft 10 is movable in the Z-axis direction in the ring 52, and the shaft 10 is rotatable about the central axis 100 in the ring 52. However, the space formed between the inner surface of the ring 52 and the outer surface of the shaft 10 is smaller than the space formed between the inner surface of the through hole 51A excluding the enlarged parts 51B and the outer surface of the shaft 10. Note that the ring 52 on the upper side in the Z-axis direction will be referred to as a first ring 52A, and the ring 52 on the lower side in the Z-axis direction will be referred to as a second ring 52B. The first ring 52A and the second ring 52B will be referred to simply as the rings 52 when the rings are not distinguished. In a material of the ring 52, for example, a metal or a resin may be used.

A protrusion 511 protruding in opposite right and left directions in the X-axis direction is formed in a central part of the housing body 51 in the Z-axis direction. In the protrusion 511, a mounting surface 511A is formed which is a surface parallel to the lower end face 202 of the housing 2, the surface coming in contact with the lower end face 202, when the shaft housing 50 is mounted to the lower end face 202 of the housing 2. The mounting surface 511A is a surface orthogonal to the central axis 100. Furthermore, a part 512 that is a part of the shaft housing 50 on the upper side of the mounting surface 511A in the Z-axis direction is formed to fit in the recess 202B formed in the housing 2, when the shaft housing 50 is mounted to the housing 2.

The space is provided between the inner surface of the through hole 51A and the outer surface of the shaft 10 as described above. As a result, in the housing body 51, an inner space 500 is formed which is a space surrounded with the inner surface of the through hole 51A, the outer surface of the shaft 10, a lower end face of the first ring 52A, and an upper end face of the second ring 52B. Furthermore, in the shaft housing 50, a control passage 501 is formed which communicates between an opening of the air flow passage 202A formed in the lower end face 202 of the housing 2 and the inner space 500 to form an air passage. The control passage 501 includes a first passage 501A extending in the X-axis direction, a second passage 501B extending in the Z-axis direction, and a filter part 501C that is a space where the first passage 501A and the second passage 501B are connected and the filter 53 is disposed. The first passage 501A has one end connected to the inner space 500, and the other end connected to the filter part 501C. The second passage 501B has one end opened in the mounting surface 511A and aligned to be connected to the opening of the air flow passage 202A.

Furthermore, the second passage 501B has the other end connected to the filter part 501C. In the filter part 501C, the filter 53 formed in a cylindrical shape is provided. The filter part 501C is formed in a columnar space extending in the X-axis direction such that a central axis coincides with that of the first passage 501A. An inner diameter of the filter part 501C is substantially equal to an outer diameter of the filter 53. The filter 53 is inserted into the filter part 501C in the X-axis direction. After the filter 53 is inserted into the filter part 501C, an end of the filter part 501C which is an insertion port of the filter 53 is closed with the filter stop 54. The other end of the second passage 501B is connected to the filter part 501C from a side of an outer circumferential surface of the filter 53. Furthermore, the other end of the first passage 501A communicates with a central side of the filter 53. Therefore, air flowing through a space between the first passage 501A and the second passage 501B flows through the filter 53. Therefore, foreign matter is captured by the filter 53, even if the foreign matter is sucked together with air into the inner space 500, for example, when the negative pressure is generated at the tip 10A. In the one end of the second passage 501B, a groove 501D is formed to hold sealant.

In vicinities of opposite ends of the protrusion 511 in the X-axis direction, two bolt holes 51G are formed into which bolts are inserted, when the shaft housing 50 is fixed to the housing 2 by use of the bolts. The bolt holes 51G extend through the protrusion 511 in the Z-axis direction and opens in the mounting surface 511A.

A hollow part 11 is formed on the tip 10A side of the shaft 10 such that the shaft 10 is hollow. The hollow part 11 has one end opened at the tip 10A. Furthermore, at the other end of the hollow part 11, a communication hole 12 that communicates between the inner space 500 and the hollow part 11 in the X-axis direction is formed. The communication hole 12 is formed to communicate between the inner space 500 and the hollow part 11, in an entire range of a stroke when the shaft 10 is moved in the Z-axis direction by the linear motion motor 30. Therefore, the tip 10A of the shaft 10 communicates with the air control mechanism 60 through the hollow part 11, the communication hole 12, the inner space 500, the control passage 501, and the air flow passage 202A. Note that the communication hole 12 may be formed in the Y-axis direction in addition to the X-axis direction.

According to this configuration, the communication hole 12 always communicates between the inner space 500 and the hollow part 11, even if the shaft 10 is at any position in the Z-axis direction when the linear motion motor 30 is driven to move the shaft 10 in the Z-axis direction. Furthermore, the communication hole 12 always communicates between the inner space 500 and the hollow part 11, even if a rotation angle of the shaft 10 is any angle about the central axis 100 when the rotating motor 20 is driven to rotate the shaft 10 about the central axis 100. Therefore, a communication state between the hollow part 11 and the inner space 500 is maintained even if the shaft 10 is in any state, and hence the hollow part 11 always communicates with the air control mechanism 60. For that reason, air in the hollow part 11 is sucked through the air flow passage 202A, the control passage 501, the inner space 500, and the communication hole 12, if the positive pressure solenoid valve 63A is closed and the negative pressure solenoid valve 63B is opened in the air control mechanism 60, regardless of the position of the shaft 10. As a result, the negative pressure can be generated in the hollow part 11. That is, the negative pressure can be generated at the tip 10A of the shaft 10, and hence the workpiece W can be sucked to the tip 10A of the shaft 10. Note that the space is also formed between the inner surface of the ring 52 and the outer surface of the shaft 10 as described above. However, this space is smaller than a space that forms the inner space 500 (i.e., the space formed between the inner surface of the through hole 51A and the outer surface of the shaft 10). Thus, in the air control mechanism 60, the positive pressure solenoid valve 63A is closed and the negative pressure solenoid valve 63B is opened, so that a flow rate of air flowing through the space between the inner surface of the ring 52 and the outer surface of the shaft 10 can be suppressed, even if air is sucked from the inner space 500. Consequently, the negative pressure at which the workpiece W can be picked up can be generated at the tip 10A of the shaft 10. On the other hand, the positive pressure can be generated in the hollow part 11, if the positive pressure solenoid valve 63A is opened and the negative pressure solenoid valve 63B is closed in the air control mechanism 60, regardless of the position of the shaft 10. That is, since the positive pressure can be generated at the tip 10A of the shaft 10, the workpiece W can be quickly removed from the tip 10A of the shaft 10.

(Pick and Place Operation)

Description will be made as to pick and place of the workpiece W by use of actuator 1. The controller 7 executes a predetermined program to perform the pick and place. During the pickup of the workpiece W, the positive pressure solenoid valve 63A and the negative pressure solenoid valve 63B are both in a closed state, until the shaft 10 comes in contact with the workpiece W. In this case, the pressure of the tip 10A of the shaft 10 is the atmospheric pressure. Then, the linear motion motor 30 moves the shaft 10 downward in the Z-axis direction. Upon contact of the shaft 10 with the workpiece W, the linear motion motor 30 is stopped. After the linear motion motor 30 is stopped, the negative pressure solenoid valve 63B is opened to generate the negative pressure at the tip 10A of the shaft 10, thereby sucking the workpiece W to the tip 10A of the shaft 10. Afterward, the linear motion motor 30 moves the shaft 10 upward in the Z-axis direction. At this time, the shaft 10 is rotated by the rotating motor 20 as required. Thus, the workpiece W can be picked up.

Next, during the placing of the workpiece W, the shaft 10 in a state where the workpiece W is sucked to the tip 10A is moved downward in the Z-axis direction by the linear motion motor 30. If the workpiece W is grounded, the linear motion motor 30 is stopped, to stop the movement of the shaft 10. Furthermore, the negative pressure solenoid valve 63B is closed and the positive pressure solenoid valve 63A is opened, to generate the positive pressure in the tip 10A of the shaft 10. Afterward, the linear motion motor 30 moves the shaft 10 upward in the Z-axis direction, and the tip 10A of the shaft 10 accordingly leaves the workpiece W.

Here, during the pickup of the workpiece W, it is detected, using the strain gauge 37, that the tip 10A of the shaft 10 comes in contact with the workpiece W. Hereinafter, this method will be described. Note that it is similarly detected that the workpiece W is grounded during the placing of the workpiece W. If the tip 10A of the shaft 10 comes in contact with the workpiece W and the tip 10A pushes the workpiece W, a load is generated between the shaft 10 and the workpiece W. That is, the shaft 10 receives a force from the workpiece W due to reaction when the shaft 10 applies the force to the workpiece W. The force received from the workpiece W by the shaft 10 acts in a direction to generate strain relative to the coupling arm 36. That is, the strain is generated in the coupling arm 36 at this time. This strain is detected by the strain gauge 37. Then, the strain detected by the strain gauge 37 has correlation with the force received from the workpiece W by the shaft 10. Consequently, the force received from the workpiece W by the shaft 10, that is, the load generated between the shaft 10 and the workpiece W can be detected based on a detected value of the strain gauge 37. A relation between the detected value of the strain gauge 37 and the load can be obtained beforehand by experiment, simulation or the like. Additionally, in the following description, the detected value of the strain gauge 37 includes the load detected by the strain gauge 37.

Thus, since the load generated between the shaft 10 and the workpiece W can be detected based on the detected value of the strain gauge 37, for example, it may be determined that the tip 10A of the shaft 10 comes in contact with the workpiece W in a case where a detected load is equal to or larger than a predetermined load. Note that the predetermined load is a load by which it is determined that the shaft 10 comes in contact with the workpiece W, and is set beforehand. Furthermore, the predetermined load may be set as the load with which it is possible to more securely pick up the workpiece W while inhibiting damage on the workpiece W. The predetermined load can be changed in accordance with a type of workpiece W. In addition, the predetermined load is an example of a predetermined value.

Here, change in resistance of the strain gauge 37 due to the strain is extremely small, and hence the change is taken as change in voltage by use of a Wheatstone bridge circuit. In the actuator 1, an output of a bridge circuit associated with the first strain gauge 37A and an output of a bridge circuit associated with the second strain gauge 37B are connected in parallel. Thus, the outputs of both the bridge circuits are connected in parallel, and accordingly the change in voltage is obtained, from which influence of temperature is eliminated as follows.

Here, assuming that there is not any strain of the coupling arm 36 due to the influence of temperature, the loads detected by the first strain gauge 37A and the second strain gauge 37B, respectively, are about the same. However, for example, in a case where operation frequency of the linear motion motor 30 is high and operation frequency of the rotating motor 20 is low, a temperature on a linear motion motor 30 side is higher than a temperature on a rotating motor 20 side. Therefore, an expansion amount in the Z-axis direction of the linear motion table 33 is larger than an expansion amount in the Z-axis direction of the rotating motor 20, between the first arm 36A and the second arm 36B. Consequently, the first arm 36A is not parallel to the second arm 36B, and a distance between the first arm 36A and the second arm 36B is larger on the linear motion motor 30 side than on the rotating motor 20 side. At this time, the first strain gauge 37A contracts, and the second strain gauge 37B expands. In this case, the output of the first strain gauge 37A apparently indicates the generation of the load, and the output of the second strain gauge 37B apparently indicates generation of a negative load. At this time, a force generated due to a difference between the expansion amount in the Z-axis direction of the linear motion table 33 and the expansion amount in the Z-axis direction of the rotating motor 20 is equally applied to the first arm 36A and the second arm 36B in opposite directions, and hence the output of the first strain gauge 37A and the output of the second strain gauge 37B have an equal absolute value and are different in positive or negative sign. For that reason, if the outputs of both the strain gauges are connected in parallel, the outputs due to the influence of temperature can cancel each other, and hence it is not necessary to separately perform correction in accordance with the temperature. Therefore, the load can be simply and accurately detected. Thus, the outputs of both the bridge circuits are connected in parallel, so that the change in voltage from which the influence of temperature is eliminated can be obtained, and this change in voltage has a value corresponding to the load generated between the shaft 10 and the workpiece W.

Note that in the present embodiment, two strain gauges 37 are provided, and instead of this, only one of the first strain gauge 37A or the second strain gauge 37B may be provided. In this case, the detected value of the strain gauge is corrected in accordance with the temperature by use of known technology. Even in a case where one strain gauge 37 is provided, the output of the strain gauge 37 has a value corresponding to the load generated between the shaft 10 and the workpiece W. Consequently, the load generated between the shaft 10 and the workpiece W can be detected based on the output of the strain gauge 37.

Thus, the strain gauges 37 are provided in the coupling arms 36, and hence it can be detected that the shaft 10 comes in contact with the workpiece W. Also, the appropriate force can be applied to the workpiece W during the pickup of the workpiece W, during the pressing of the workpiece W, and during the placing of the workpiece W, so that the pickup, pressing and placing of the workpiece W can be more securely executed. For example, when the workpiece W is picked up, the negative pressure is generated in the hollow part 11 in a state where the workpiece W is pressed against the tip 10A of the shaft 10. Consequently, it is possible to more securely pick up the workpiece W, and it is possible to inhibit the workpiece W from strongly colliding with the shaft 10 and being damaged when the workpiece W is sucked. On the other hand, if the load to press the workpiece W is excessively large, the workpiece W might be damaged. To solve this problem, an appropriate load is applied to the workpiece W while detecting the force to be applied to the workpiece W, so that it is possible to more securely pick up the workpiece W while inhibiting the damage on the workpiece W. Also, during the pressing of the workpiece W that does not include the pickup, the appropriate load is applied to the workpiece W while detecting the force to be applied to the workpiece W, so that it is possible to more securely press the workpiece while inhibiting the damage on the workpiece W. Furthermore, also during the placing, it may be required to apply the appropriate load to the workpiece W. For example, it is necessary to apply a load in accordance with characteristics of bonding, in a case where the workpiece W is bonded to another member by use of adhesive. Also, at this time, appropriate control of the force to be applied to the workpiece W allows more secure bonding.

Here, the shaft 10 is movable in the Z-axis direction in each ring 52, and hence the space is formed between the inner surface of the ring 52 and the outer surface of the shaft 10. If this space is large, gas easily flows through this space, which influences generation of the negative pressure at the tip 10A of the shaft 10. Therefore, it is desirable that this space is smaller. However, if this space is reduced, the shaft 10 may come in contact with the shaft housing 50 due to tolerance, deterioration over time, temperature or the like, even in a case where the shaft 10 is formed not to come in contact with the shaft housing 50. Then, if the shaft 10 comes in contact with the shaft housing 50 during the movement of the shaft 10 in the central axis direction, the shaft 10 is slid relative to the shaft housing 50. This might generate the friction force. The strain gauge 37 is attached on a side closer to the linear motion motor 30 than to the shaft housing 50, and hence the detected value of the strain gauge 37 includes the friction force generated between the shaft housing 50 and the shaft 10.

Here, FIG. 4 is a time chart illustrating transition of the detected value of the strain gauge 37. FIG. 4 is a chart in a case where the shaft 10 is being moved in a range that does not come in contact with the workpiece W. L1 indicates the detected value of the strain gauge 37 in a case where the shaft 10 is being moved in a negative direction of the Z-axis (downward in FIG. 2), and temperature is comparatively low. L2 indicates the detected value of the strain gauge 37 in a case where the shaft 10 is being moved downward in FIG. 2, and temperature is higher than that in L1 (e.g., a case at normal temperature). On the other hand, L3 indicates the detected value of the strain gauge 37 in a case where the shaft 10 is being moved in a positive direction of the Z-axis (upward in FIG. 2), and temperature is the same as in L2. L4 indicates the detected value of the strain gauge 37 in a case where the shaft 10 is being moved upward in FIG. 2, and temperature is the same as in L1.

In L1 and L2, the shaft 10 is being moved downward in FIG. 2, and hence a frictional resistance with the shaft housing 50 acts upward in FIG. 2 relative to the shaft 10. On the other hand, in L3 and L4, the shaft 10 is being moved upward in FIG. 2, and hence the frictional resistance with the shaft housing 50 acts downward in FIG. 2 relative to the shaft 10. As illustrated in FIG. 4, the frictional resistance differs with the temperature and the moving direction of the shaft 10. Furthermore, these frictional resistances may change also with humidity and deterioration over time.

The friction force generated by the sliding of the shaft 10 is generated also after the shaft 10 comes in contact with the workpiece W, if the shaft 10 is moved. Therefore, when it is determined, based on the detected value of the strain gauge 37, whether or not the shaft 10 comes in contact with the workpiece W, the detected value of the strain gauge 37 includes the friction force. Even if the linear motion motor 30 is controlled based on the detected value of the strain gauge 37, it might be difficult to adjust, to the predetermined load, the actual load applied to the shaft 10 and the workpiece W. This friction force may change with the temperature, humidity, deterioration over time or the like, and hence accuracy of correction might drop even if a correction value is set beforehand.

On the other hand, in the present embodiment, by use of correlation between the detected value of the strain gauge 37 when the shaft 10 is being moved in a direction coming close to the workpiece W before the shaft 10 applies the force to the workpiece W (e.g., before the shaft 10 comes in contact with the workpiece W) and the friction force generated between the shaft 10 and the shaft housing 50, the subsequent detected value of the strain gauge 37 or the predetermined load is corrected. That is, the detected value of the strain gauge 37 when the shaft 10 is being moved toward the workpiece W before the shaft 10 applies the force to the workpiece W indicates the friction force, and hence the friction force is detected by the strain gauge 37 before the shaft 10 applies the force to the workpiece W. A dynamic friction force does not change before and after the shaft 10 applies the force to the workpiece W, and hence the friction force detected before the shaft 10 applies the force to the workpiece W is considered to be similarly applied to the shaft 10 even after the shaft 10 applies the force to the workpiece W. Consequently, based on the friction force detected before the shaft 10 applies the force to the workpiece W, the detected value of the strain gauge 37 after the shaft 10 applies the force to the workpiece W can be corrected, and the predetermined load that is a threshold during control of the linear motion motor 30 can be corrected. The detection of the friction force for the correction is performed, for example, immediately before the workpiece W is picked up, every time the workpiece W is to be picked up. Also, the detection is performed, for example, immediately before the workpiece W is pressed, every time the workpiece W is to be pressed. Further, the detection is performed, for example, immediately before the workpiece W is placed, every time the workpiece W is to be placed.

FIG. 5 is a time chart illustrating the transition of the detected value of the strain gauge 37 during the pickup of the workpiece W. In FIG. 5, a solid line indicates a case where the friction force when the shaft 10 is slid in the shaft housing 50 is comparatively large, and a dashed chain line indicates a case where the friction force is comparatively small. For example, even in a case where the same actuator 1 performs the same operation, the friction force may change with the temperature, humidity, deterioration over time or the like. Also, in FIG. 5, T1 is time when the shaft 10 starts moving. At and before T1, the shaft 10 is stopped. Further, in FIG. 5, T2 is time when a speed of the shaft 10 becomes stable. Also, T3 is time when the shaft 10 starts coming in contact with the workpiece W. Note that T3 may be time when a part of the shaft 10 starts coming in contact with the workpiece W. T4 is time when the load applied to the shaft 10 and the workpiece W reaches a predetermined load. T4 may be time to detect that the shaft 10 comes in contact with the workpiece W, or time to stop moving the shaft 10 because the shaft 10 comes in contact with the workpiece W. Also, at T4, stop control to stop the shaft 10 may be performed, and at T4, feedback control may be started such that the detected value of the strain gauge 37 indicates the predetermined load.

Here, in a period from T1 to T3, the shaft 10 is away from the workpiece W, and hence it is considered that the detected value of the strain gauge 37 at this time is due to the friction force received by the shaft 10 from the shaft housing 50. On the other hand, at and after T3, at least a part of the shaft 10 is in contact with the workpiece W, and hence it is considered that the detected value is due to both of a reaction force when the workpiece W is pushed with the shaft 10 and the friction force received by the shaft 10 from the shaft housing 50.

The detected value at and before T1 is 0 (N). Note that the strain gauge 37 may be calibrated beforehand such that the detected value at and before T1 is 0. A period from T1 to T2 is a period during which the friction force fluctuates with increase in speed of the shaft 10. It may be considered that this period is a period during which the detected value of the strain gauge 37 is not stable because the value is influenced by the acceleration of the shaft 10. In a period from T2 to T3, although the shaft 10 is being moved, the friction force is stable. At this time, the shaft 10 is not in contact with the workpiece W, and hence it can be considered that the detected value of the strain gauge 37 at this time is due to the friction force. To solve the problem, in the present embodiment, the detected value of the strain gauge 37 in the period from T2 to T3 is considered to indicate the friction force received by the shaft 10 from the shaft housing 50, and based on this friction force, the detected value of the strain gauge 37 at and after T3 or a threshold for control (e.g., the predetermined load) is corrected. In addition, the period from T2 to T3 is an example of the predetermined period. Specifically, when the shaft 10 is being moved also at and after T3, the same friction force as in the period from T2 to T3 is applied to the shaft 10, and hence the detected value in the period from T2 to T3 is used as a correction amount. For example, in a case of correcting the detected value of the strain gauge 37 at and after T3, the correction amount is subtracted from the detected value. On the other hand, in a case of correcting the predetermined load for the control at and after T3, the correction amount is added to the predetermined load. Hereinafter, description will be made as to a case of correcting the predetermined load.

For example, the case illustrated with the solid line in FIG. 5 will be described. The detected value in the period from T2 to T3 is obtained as a first correction amount. Then, the first correction amount is added to the predetermined load before corrected, to obtain the predetermined load after corrected. For the corrected predetermined load as a target, the feedback control or the stop control is executed. Similarly, the case illustrated with the broken line in FIG. 5 will be described. The detected value in the period from T2 to T3 is obtained as a second correction amount. Then, the second correction amount is added to the predetermined load before corrected, to obtain the predetermined load after corrected. For the corrected predetermined load as the target, the feedback control or the stop control is executed. For example, the detected value of the strain gauge 37 or the predetermined load is corrected every pickup and every placing of the workpiece W, so that it is possible to perform more appropriate control also quickly in response to change in friction force due to change in temperature or the like. Specifically, in the stop control, the shaft 10 can be stopped at more appropriate timing. Also, in the feedback control, more appropriate load can be applied to the workpiece W. Note that the correction amount may be obtained in the whole period from T2 to T3 as a target, or the correction amount may be obtained in a shorter period as a target of the period from T2 to T3.

(Pick and Place Control)

Next, specific control of pick and place will be described. The controller 7 executes the predetermined program, to perform this pick and place. Note that in the present embodiment, the output of the strain gauge 37 is replaced with the load, and the linear motion motor 30 is controlled based on this load. Instead of this, the linear motion motor 30 may be directly controlled based on the output of the strain gauge 37. First, pickup processing will be described. FIG. 6 is a flowchart illustrating flow of the pickup processing. The present flowchart is executed by the controller 7 every predetermined time. This predetermined time is set in accordance with tact time. In an initial state, the shaft 10 is at a sufficient distance from the workpiece W.

In step S101, the positive pressure solenoid valve 63A and the negative pressure solenoid valve 63B are both closed. That is, the pressure at the tip 10A of the shaft 10 is set to the atmospheric pressure. In step S102, the shaft 10 is lowered. That is, the linear motion motor 30 is driven to move the shaft 10 downward in the Z-axis direction. In step S103, the load applied to the shaft 10 is detected by the output of the strain gauge 37. In step S104, it is determined whether or not the load applied to the shaft 10 is stable. Specifically, it is determined whether or not the period is from T2 to T3 illustrated in FIG. 5. In the step S104, for example, if the fluctuation of the detected value of the strain gauge 37 continues in a state of being in a predetermined range for a predetermined time, it may be determined that the load applied to the shaft 10 is stable. In a case where the load applied to the shaft 10 is stable in a state where the shaft 10 is being moved, it can be determined that the detected value of the strain gauge 37 at this time indicates the friction force. The predetermined time and predetermined range are obtained beforehand by experiment, simulation or the like such that stability of the detected value can be detected. Thus, it is determined whether or not the load applied to the shaft 10 is stable, so that influence of the acceleration of the shaft 10 can be suppressed. Alternatively, in the present step S104, a position sensor that detects a position of the shaft 10 may be used together, and it may be confirmed beforehand that the shaft 10 is located not to be in contact with the workpiece W.

Here, when the shaft 10 is being moved, the detected value of the strain gauge 37 may fluctuate. Therefore, the detected value of the strain gauge 37 may not be strictly constant. However, even in a case where the detected value of the strain gauge 37 fluctuates, the friction force received by the shaft 10 can be obtained, for example, by smoothing the detected value. Note that known processing can be adopted in smoothing the detected value. At this time, for example, an average value of the detected values may be obtained, or the detected value may be moderated. The detected value of the strain gauge 37 may be smoothed to set the predetermined time and the predetermined range such that the friction force received by the shaft 10 can be accurately obtained, that is, calculation accuracy of the friction force falls in a permissible range. If affirmative determination is made in the step S104, the processing advances to step S105, and if negative determination is made, the processing returns to the step S103.

In the step S105, the correction amount of the predetermined load is calculated. For example, an average value of loads detected in the predetermined time in the step S104 is calculated as the correction amount. The predetermined load here is set, for example, as a load by which it is determined that the shaft 10 comes in contact with the workpiece W, or a load with which the workpiece W can be more securely picked up while inhibiting damage on the workpiece W. In step S106, the predetermined load is corrected. The predetermined load before corrected is stored beforehand, for example, in a memory. Then, the corrected predetermined load is calculated by adding the correction amount calculated in the step S105 to the predetermined load before corrected. The corrected predetermined load is stored in the memory, for use in the subsequent control.

In step S107, the strain gauge 37 detects the load applied to the shaft 10. In step S108, it is determined whether or not the load applied to the shaft 10 is equal to or more than the predetermined load. This predetermined load is the corrected predetermined load that is calculated in the step S106. If affirmative determination is made in the step S108, the processing advances to step S109, and if negative determination is made, the processing returns to the step S107. Therefore, the linear motion motor 30 moves the shaft 10 downward in the Z-axis direction until the load applied to the shaft 10 reaches the predetermined load or more.

In the step S109, the linear motion motor 30 is stopped. Note that energization to the linear motion motor 30 may be feedback controlled to continuously apply the predetermined load to the shaft 10.

In step S110, the negative pressure solenoid valve 63B is opened. Note that a closed valve state of the positive pressure solenoid valve 63A is maintained. Consequently, the negative pressure is generated at the tip 10A of the shaft 10, to suck the workpiece W to the tip 10A of the shaft 10. In step S111, the shaft 10 is raised. At this time, the linear motion motor 30 moves the shaft 10 by a predetermined distance upward in the Z-axis direction. At this time, the shaft 10 may be rotated by the rotating motor 20 as required. Thus, the workpiece W can be picked up. Note that the processing illustrated in FIG. 6 can be applied also to the case of pressing the workpiece W. In this case, the processing of the step S101 and step S110 is omitted.

Next, place processing will be described. FIG. 7 is a flowchart illustrating flow of the place processing. The place processing is executed by the controller 7, after the pickup processing illustrated in FIG. 6. At start of the place processing, the workpiece W is sucked to the tip of the shaft 10. That is, the positive pressure solenoid valve 63A is closed, and the negative pressure solenoid valve 63B is opened. In step S201, the shaft 10 is lowered. That is, the linear motion motor 30 is driven to move the shaft 10 downward in the Z-axis direction.

In step S202, the strain gauge 37 detects the load applied to the shaft 10. In step S203, it is determined whether or not the load applied to the shaft 10 is stable. Here, processing similar to that of the step S104 is executed. If affirmative determination is made in the step S203, the processing advances to step S204, and if negative determination is made, the processing returns to the step S202.

In the step S204, a correction amount of a second predetermined load is calculated. For example, an average value of loads detected in the predetermined time in the step S203 is calculated as the correction amount. The second predetermined load here is a load by which it is determined that the workpiece W is grounded, or a load by which it is determined that the workpiece W comes in contact with another member. Note that the second predetermined load may be set as a load with which the workpiece W can be more securely placed while inhibiting damage on the workpiece W. In step S205, the second predetermined load is corrected. The second predetermined load before corrected is stored beforehand, for example, in the memory. Then, the second predetermined load after corrected is calculated by adding the correction amount calculated in the step S204 to the second predetermined load before corrected. The corrected second predetermined load is stored in the memory, for use in the subsequent control.

In step S206, the strain gauge 37 detects the load applied to the shaft 10. In step S207, it is determined whether or not the load applied to the shaft 10 is equal to or more than the second predetermined load. This second predetermined load is the second predetermined load corrected in the step S205. If affirmative determination is made in the step S207, the processing advances to step S208, and if negative determination is made, the processing returns to the step S206. Therefore, the linear motion motor 30 moves the shaft 10 downward in the Z-axis direction until the load applied to the shaft 10 reaches the second predetermined load or more.

In the step S208, the linear motion motor 30 is stopped. Note that energization to the linear motion motor 30 may be feedback controlled to continuously apply the second predetermined load to the shaft 10, even in a case where the linear motion motor 30 is stopped.

In step S209, the positive pressure solenoid valve 63A is opened, and the negative pressure solenoid valve 63B is closed. Consequently, the positive pressure is generated at the tip 10A of the shaft 10, to remove the workpiece W from the shaft 10. In step S210, the shaft 10 is raised. That is, the linear motion motor 30 moves the shaft 10 by a predetermined distance upward in the Z-axis direction. At this time, the shaft 10 may be rotated by the rotating motor 20 as required. Thus, the workpiece W can be placed.

As described above, according to the actuator 1 of the present embodiment, the appropriate load can be applied to the workpiece W by controlling the linear motion motor 30 based on the load applied to the shaft 10, while taking, into consideration, the influence of the friction force applied to the shaft 10, and hence it is possible to more securely pick up the workpiece W, press the workpiece W, and place the workpiece W, while inhibiting the damage on the workpiece W.

Second Embodiment

In the present embodiment, description will be made as to a friction force when a shaft 10 is moved in a positive direction of a Z-axis (upward in FIG. 2). Description as to another device and the like that are the same as in the first embodiment is omitted. FIG. 8 is a time chart illustrating transition of a detected value of a strain gauge 37 during pickup of a workpiece W. The chart illustrates, for example, a case where the workpiece W is picked up while the shaft 10 is being moved in the positive direction of the Z-axis in FIG. 2. Times T1, T2, T3 and T4 in FIG. 8 are similar to T1, T2, T3 and T4 in FIG. 5. Compared to FIG. 5, in FIG. 8, a direction of the force is opposite, and hence the detected value is a negative value, but idea is the same as in FIG. 5.

For example, the detected value in a period from T2 to T3 is obtained as a correction amount. Then, a corrected predetermined load is obtained by adding the correction amount to a predetermined load before corrected. For the corrected predetermined load as a target, feedback control and stop control of a linear motion motor 50 are executed. Note that instead of correcting the predetermined load, the detected value of the strain gauge 37 may be corrected. Thus, the detected value of the strain gauge 37 or the predetermined load is corrected, for example, every pickup and every placing of the workpiece W, so that more appropriate control can be performed quickly in response to change in friction force due to change in temperature or the like.

Thus, the friction force when the shaft 10 moved upward is slid in a shaft housing 50 is obtained, so that the detected value of the strain gauge 37 or the correction amount of the predetermined load can be calculated. Consequently, even in the case where the shaft 10 is moved upward, more appropriate control is allowed.

Another Embodiment

In the actuator 1, the coupling arms 36 are provided with the strain gauges 37, respectively, and alternatively, coupling arms 35 may be provided with the strain gauges 37, respectively. Further, in the above embodiments, the load applied to the shaft 10 and the workpiece W is detected by using each strain gauge 37, but another sensor or the like may be used. In this case, the load applied to the shaft 10 and the workpiece W is detected at a position where a friction force generated by the shaft 10 being slid in a shaft housing 50 is detected. Specifically, the load is detected on a side closer to a linear motion motor 30 than to the shaft housing 50. For example, in a case where a force sensor is disposed at a tip 10A of the shaft 10, the friction force when the shaft 10 is being moved does not influence a detected value of this force sensor, and hence it is not necessary to apply the present invention. Specifically, the present invention is applied to a case where a force detecting sensor or the like is disposed on the side closer to the linear motion motor 30 than to the shaft housing 50 (i.e., a side closer to a drive part than to a fixing part). This sensor may be a load cell or a piezoelectric sensor. Such a sensor can be disposed on the shaft 10 above the shaft housing 50, each coupling arm 36, each coupling arm 35, a mover 32, a linear motion table 33, a rotating motor 20 or the like. Specifically, the sensor can be disposed on a member interposed between the shaft 10 above the shaft housing 50 and the linear motion motor 30.

Also, in the above embodiments, the detected value when the detected value of the strain gauge 37 is stable is obtained as the correction amount, and alternatively, the correction amount may be obtained when it is determined that the speed of the shaft 10 is stable in a case where a change amount of the speed of the shaft 10 continues in a state of being in a predetermined range for a predetermined period. Immediately after the shaft 10 starts moving, the shaft 10 is accelerated, and hence the speed of the shaft 10 is not stable. Therefore, the detected value of the strain gauge 37 is also not stable. On the other hand, if the speed of the shaft 10 is stable, it can be considered that the detected value of the strain gauge 37 is also stable, and hence the detected value of the strain gauge 37 at this time may be obtained as the correction amount. Specifically, a period to obtain the correction amount can be obtained by using a detected value of the speed of the shaft 10 in place of the detected value of the strain gauge 37. The speed of the shaft 10 may be detected, for example, by a sensor disposed in the linear motion motor 30. Furthermore, the correction amount may be obtained in a case where both or one of the detected value of the strain gauge 37 and the speed of the shaft 10 is stable. Thus, the period to obtain the correction amount can be determined based on the speed of the shaft 10. This can suppress influence of the acceleration of the shaft 10.

DESCRIPTION OF THE REFERENCE NUMERALS AND SYMBOLS

1 . . . actuator, 2 . . . housing, 10 . . . shaft, 10A . . . tip, 11 . . . hollow part, 20 . . . rotating motor, 22 . . . stator, 23 . . . rotor, 30 . . . linear motion motor, 31 . . . stator, 32 . . . mover, 36 . . . coupling arm, 37 . . . strain gauge, 50 . . . shaft housing, 60 . . . air control mechanism

The invention claimed is:
1. An actuator comprising:
   a shaft that is moved in an axial direction of the shaft to apply a force to a workpiece,
   a drive part that moves the shaft in the axial direction of the shaft,
   a fixing part disposed around the shaft, the shaft being moved relative to the fixing part when the drive part moves the shaft,
   a detector that detects a force applied to the shaft, the detector being disposed at a position closer to the drive part than to the fixing part,
   a control processor, and
   a memory element storing a program configured to control the drive part, wherein, by executing the program, the control processor obtains a first force that is detected by the detector in a predetermined period of a period during which the shaft is being moved before the shaft applies the force to the workpiece, the first force being associated with a friction force generated when the shaft slides, and after the predetermined period, controls the drive part based on the force detected by the detector and the first force, and said before the shaft applies the force to the workpiece is defined as one of conditions: (i) before a part of the shaft comes in contact with the workpiece during a pickup of the workpiece or (ii) before a part of the shaft comes in contact with the workpiece during a pressing of the workpiece, or (iii) before the shaft grounds the workpiece during a placing of the workpiece or (iv) before the shaft causes the workpiece to come in contact with an external member outside an actuator during the placing of the workpiece, the external member is a member in which the workpiece is placed.

2. The actuator according to claim 1, wherein the control processor by executing the program obtains the first force, when the shaft is being moved in a direction coming close to the workpiece in the predetermined period.

3. The actuator according to claim 1, wherein the control processor by executing the program sets the predetermined period as a period during which a fluctuation of the force detected by the detector continues in a state of being in a predetermined range.

4. The actuator according to claim 1, wherein the control processor by executing the program sets the predetermined period as a period during which a fluctuation of a speed of the shaft continues in a state of being in a predetermined range.

5. The actuator according to claim 1, wherein the control processor by executing the program performs, after the predetermined period, stop control that is control to stop the drive part when the force detected by the detector reaches a predetermined value or more, and the control processor by executing the program, in the stop control, corrects the predetermined value by adding the first force to the predetermined value, or corrects the force detected by the detector by subtracting the first force from the force detected by the detector.

6. The actuator according to claim 1, wherein the control processor by executing the program performs, after the predetermined period, feedback control of the drive part such that the force detected by the detector reaches a predetermined value, and the control processor by executing the program, in the feedback control, corrects the predetermined value by adding the first force to the predetermined value, or corrects the force detected by the detector by subtracting the first force from the force detected by the detector.

* * * * *